(12) United States Patent
Nayfeh et al.

(10) Patent No.: US 7,429,369 B2
(45) Date of Patent: Sep. 30, 2008

(54) SILICON NANOPARTICLE NANOTUBES AND METHOD FOR MAKING THE SAME

(75) Inventors: Munir H. Nayfeh, Urbana, IL (US); Sahraoui Chaieb, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 884 days.

(21) Appl. No.: 10/864,072

(22) Filed: Jun. 9, 2004

(65) Prior Publication Data

US 2008/0187480 A1 Aug. 7, 2008

Related U.S. Application Data

(63) Continuation-in-part of application No. 10/361,176, filed on Feb. 7, 2003, now Pat. No. 6,846,474, which is a continuation of application No. 09/426,389, filed on Oct. 22, 1999, now Pat. No. 6,585,947.

(51) Int. Cl.
*C01B 33/02* (2006.01)
*G02B 6/00* (2006.01)
*H01L 21/461* (2006.01)
*H01L 21/31* (2006.01)
*H01L 21/469* (2006.01)

(52) U.S. Cl. .................. 423/348; 423/349; 385/142; 438/753; 438/769; 438/771; 438/782

(58) Field of Classification Search .......... 423/350, 423/348, 349; 385/142; 438/753, 769, 771, 438/782
See application file for complete search history.

(56) References Cited

U.S. PATENT DOCUMENTS

| | | | | |
|---|---|---|---|---|
| 5,852,306 | A * | 12/1998 | Forbes ..................... | 257/315 |
| 6,361,660 | B1 | 3/2002 | Goldstein | |
| 6,585,947 | B1 * | 7/2003 | Nayfeh et al. .............. | 423/348 |
| 6,597,496 | B1 * | 7/2003 | Nayfeh et al. .............. | 359/343 |
| 6,660,152 | B2 | 12/2003 | Nayfeh et al. | |
| 6,846,474 | B2 * | 1/2005 | Nayfeh et al. .............. | 423/348 |
| 2002/0104762 | A1 | 8/2002 | Stonas et al. | |

OTHER PUBLICATIONS

Marsen et al. Fullere-structured nanowires of silicon. Physical Review B. vol. 60, No. 16. Oct. 15, 1999-II, 593-600.*
A. Smith, G. Belomoin, M.H. Nayfeh, T. Nayfeh, "Spatially Selective Electrochemical Deposition of Composite Films of Metal and Luminescent Si Nanoparticles", Chemical Physics Letters, vol. 372, 2003, pp. 415-418.
A. Smith, S. Chaieb, A. Al Aql, M. Alsalhi, M.H. Nayfeh, "Observation of Assembly of Fluorescent Si Nanoparticles under the Influence of Electric Current", Journal of Nanoscience and Nanotechnology, vol. 2, No. 5, 2002, pp. 471-473.
O.A. Saleh, L.J. Sohn, "An Artificial Nanopore for Molecular Sensing", Nano Letters, vol. 3, No. 1, 2003, pp. 37-38.
O. Akcakir, J. Therrien, G. Belomoin, N. Barry, J.D. Mueller, E. Gratton, and M. Nayfeh, "Detection of luminescent single ultrasmall silicon nanoparticles using fluctuation correlation spectroscopy", Applied Physics Letters, vol. 76, No. 14, Apr. 3, 2000, pp. 1857-1859.
M. Nayfeh, O. Akcakir, J. Therrien, Z. Yamani, N. Barry, W. Yu, and E. Gratton, "Highly nonlinear photoluminescence threshold in porous silicon", Applied Physics Letters, vol. 75, No. 26, Dec. 27, 1999, pp. 4112-4113.
M.H. Nayfeh, N. Barry, J. Therrien, O. Akcakir, E. Gratton, and G. Belomoin, "Stimulated blue emission in reconstituted films of ultrasmall silicon nanoparticles", Applied Physics Letters, vol. 78, No. 8, Feb. 19, 2001, pp. 1131-1133.
M.H. Nayfeh, O. Akcakir, G. Belomoin, N. Barry, J. Therrien, and E. Gratton, "Second harmonic generation in microcrystallite films of ultrasmall Si nanoparticles", Applied Physics Letters, vol. 77, No. 25, Dec. 18, 2000, pp. 4086-4088.
Joel Therrien, Gennadiy Belomoin, and Munir Nayfeh, "Light-induced conductance resonance in ultrasmall Si nanoparticles", Applied Physics Letters, vol. 77, No. 11, Sep. 11, 2000, pp. 1668-1770.

(Continued)

*Primary Examiner*—Vickie Kim
*Assistant Examiner*—Jennifer A Smith
(74) *Attorney, Agent, or Firm*—Greer, Burns & Crain, Ltd.

(57) ABSTRACT

A relatively thick electrode is positioned opposite the surface of a substrate/second electrode. The electrode and the substrate surface are both contacted by a solution including silicon nanoparticles. The substrate surface is completely immersed in the solution in a manner such that there is not an air/solution interface and there is no meniscus at the substrate surface. Application of electrical potential between the electrode and the substrate creates a film of silicon nanoparticles on the substrate. Drying of the film induces the film to roll up and form a silicon nanoparticle nanotube material. A film may be subdivided into an array of identical portions, and the identical portions will roll into identical tubes having same length and diameter. A silicon nanoparticle nanotube material of the invention includes nanotubes formed of silicon nanoparticles.

14 Claims, 4 Drawing Sheets

OTHER PUBLICATIONS

Gennadiy Belomoin, Joel Therrien, and Munir Nayfeh, "Oxide and hydrogen capped ultrasmall blue luminescent Si nanoparticles", Applied Physics Letters, vol. 77, No. 6, Aug. 7, 2000, pp. 779-781.

W. Howard Thompson, Zain Yamani, Laila AbuHassan, Osman Gurdal, and Munir Nayfeh, The effect of ultrathin oxides on luminescent silicon nanocrystallites, Applied Physics Letters, vol. 73, No. 6, Aug. 10, 1998.

W. Howard Thompson, Zain Yamani, Laila H. Abu Hassan, J.E. Greene, and Munir Nayfeh, "Room temperature oxidation enhancement of porous Si(001) using ultraviolet-ozone exposure", J. Appl. Phys. 80 (9), Nov. 1, 1996, pp. 5415-5421.

E. Rogozhina, G. Belomoin, A. Smith, L. Abuhassan, N. Barry and O. Akcakir, P.V. Braun, M.H. Nayfeh, "Si-N linkage in ultrabright, ultrasmall Si nanoparticles", Applied Physics Letters, vol. 78, No. 23, Jun. 4, 2001, pp. 3711-3713.

L. Mitas, J. Therrien, R. Twesten, G. Belomoin, and M.H. Nayfeh, "Effect of surface reconstruction on the structural prototypes of ultrasmall ultrabright $Si_{29}$ nanoparticles", Applied Physics Letters, vol. 78, No. 13, Mar. 26, 2001, pp. 1918-1920.

Zain Yamani, W. Howard Thompson, Laila AbuHassan, and Munir H. Nayfeh, "Ideal anodization of silicon", Applied Phys. Lett. 70 (25), Jun. 23, 1997, pp. 3404-3406.

D. Andsager, J. Hilliard, J.M. Hetrick, L.H. AbuHassan, M. Pilsch, and M.H. Nayfeh, "Quenching of porous silicon photoluminescence by deposition of metal adsorbates", J. Appl. Phys. 74 (7), Oct. 1, 1993, pp. 4783-4785.

Zain Yamani, Sahel Ashhab, Ammar Nayfeh, W. Howard Thompson, and Munir Nayfeh, "Red to green rainbow photoluminescence from unoxidized silicon nanocrystallites", Journal of Applied Physics, vol. 83, No. 7, Apr. 1, 1998, pp. 3929-3931.

Eric J. Lee, Theodore W. Bitner, James S. Ha, Michael J. Shane, and Michael J. Sailor, "Light-Induced Reactions of Porous and Single-Crystal Si Surfaces with Carboxylic Acids", J. Am. Chem. Soc. 1996, 118, pp. 5375-5382.

Eric J. Lee, James S. Ha, and Michael J. Sailor, "Photoderivatization of the Surface of Luminescent Porous Silicon with Formic Acid", J. Am. Chem. Soc. 1995, 117, pp. 8295-8296.

Vincent V. Doan and Michael J. Sailor, "Photolithographic fabrication of micron-dimension of porous Si structures exhibiting visible luminesc ence", Appl. Phys. Lett. 60 (5), Feb. 3, 1992, pp. 619-620.

D.A. Williams, R.A. McMahon, and H. Ahmed, "Seed Window Defects in Silicon on Insulator Material", Applied Surface Science 36 (1989), pp. 614-622.

M. Warntjes, C. Vieillard, F. Ozanam, and J.-N. Chazalviel, "Electrochemical Methoxylation of Porous Silicon Surface", J. Electrochem. Soc., vol. 142, No. 12, Dec. 1995, pp. 4139-4142.

* cited by examiner

SILICON NANOPARTICLE NANOTUBES AND METHOD FOR MAKING THE SAME

REFERENCE TO RELATED APPLICATIONS AND PRIORITY CLAIM

This application is a continuation-in-part of application Ser. No. 10/361,176, filed Feb. 7, 2003 now U.S. Pat. No. 6,846,474, entitled SILICON NANOPARTICLE AND METHOD FOR PRODUCING THE SAME, which was a continuation of Nayfeh et al. U.S. patent application Ser. No. 09/426,389, entitled METHOD FOR PRODUCING SILICON NANOPARTICLES, filed Oct. 22, 1999, and now U.S. Pat. No. 6,585,947. Priority from both applications is claimed under 35 U.S.C. §120.

STATEMENT OF GOVERNMENT INTEREST

This invention was made with Government support under Contract Number BES 1529304 awarded by the National Science Foundation. The Government has certain rights in the invention.

FIELD OF THE INVENTION

A field of the invention is nanomaterials.

BACKGROUND OF THE INVENTION

Silicon nanoparticles of ~1 nm diameter have shown stimulated emissions. See, Nayfeh et al. U.S. Pat. No. 6,585, 947, entitled METHOD FOR PRODUCING SILICON NANOPARTICLES; Nayfeh et al. U.S. Published Patent Application, as publication number 20020070121, published on Jul. 13, 2002 and entitled FAMILY OF DISCRETELY SIZED NANOPARTICLES AND METHOD FOR PRODUCING THE SAME. Bulk silicon is an optically dull indirect bandgap material, having a 1.1 eV indirect bandgap, a 3.2 eV direct bandgap. A 1 nm silicon nanoparticle effectively creates a new wideband direct gap material, with an energy gap of 3.55 eV, and highly efficient optical activity. A 1 nm silicon nanoparticle indirect band gap of 1.1 eV corresponds to a wavelength of 1.1 µm, which is in the infrared region. Uniformly dimensioned 1 nm silicon nanoparticles (having about 1 part in one thousand or less of greater dimensions) have characteristic blue emissions. See, e.g., Akcakir et al, "Detection of luminescent single ultrasmall silicon nanoparticles using fluctuation correlation spectroscopy", Appl. Phys. Lett. 76 (14), p. 1857 (Apr. 3, 2000). The silicon nanoparticles have also been synthesized with H- or O-termination, or functionalized with N-, or C-linkages.

In addition to the 1 nm silicon nanoparticle material, previous work has also produced a family of uniformly dimensioned nanoparticles with distinct particle sizes in the 1-3 nm range, which fluoresce spectacularly, and an additional particle that emits in the infrared band. The family includes 1 (blue emitting), 1.67 (green emitting), 2.15 (yellow emitting), 2.9 (red emitting) and 3.7 nm (infrared emitting). See, G. Belomoin et al. "Observation of a magic discrete family of ultrabright Si nanoparticles," Appl. Phys. Lett. 80(5), p 841 (Feb. 4, 2002); and United States Published Patent Application 20020070121 to Nayfeh et al.

A plating process for plating films of silicon nanoparticles is disclosed in U.S. Pat. No. 6,660,152 to Nayfeh et al, entitled ELEMENTAL SILICON NANOPARTICLE PLATING AND METHOD FOR THE SAME. In that process, silicon nanoparticles are plated in an electrolytic cell to a substrate, which is the anode of the cell when plating silicon nanoparticles and can be the cathode for composite deposits including silicon nanoparticles. Particles deposit at a solution-air interface and form a plating.

SUMMARY OF THE INVENTION

In the invention, a relatively thick electrode is positioned opposite the surface of a substrate/second electrode. The electrode and the substrate surface are both contacted by a solution including silicon nanoparticles. The substrate surface is completely immersed in the solution in a manner such that there is not an air/solution interface and there is no meniscus at the substrate surface. Application of electrical potential between the electrode and the substrate creates a film of silicon nanoparticles on the substrate. Drying of the film induces the film to roll up and form a silicon nanoparticle nanotube material. A film may be subdivided into an array of identical portions, and the identical portions will roll into identical tubes having same length and diameter. A silicon nanoparticle nanotube material of the invention includes nanotubes formed of silicon nanoparticles.

DETAILED DESCRIPTION OF THE PREFERRED EMBODIMENTS

Figure 1:
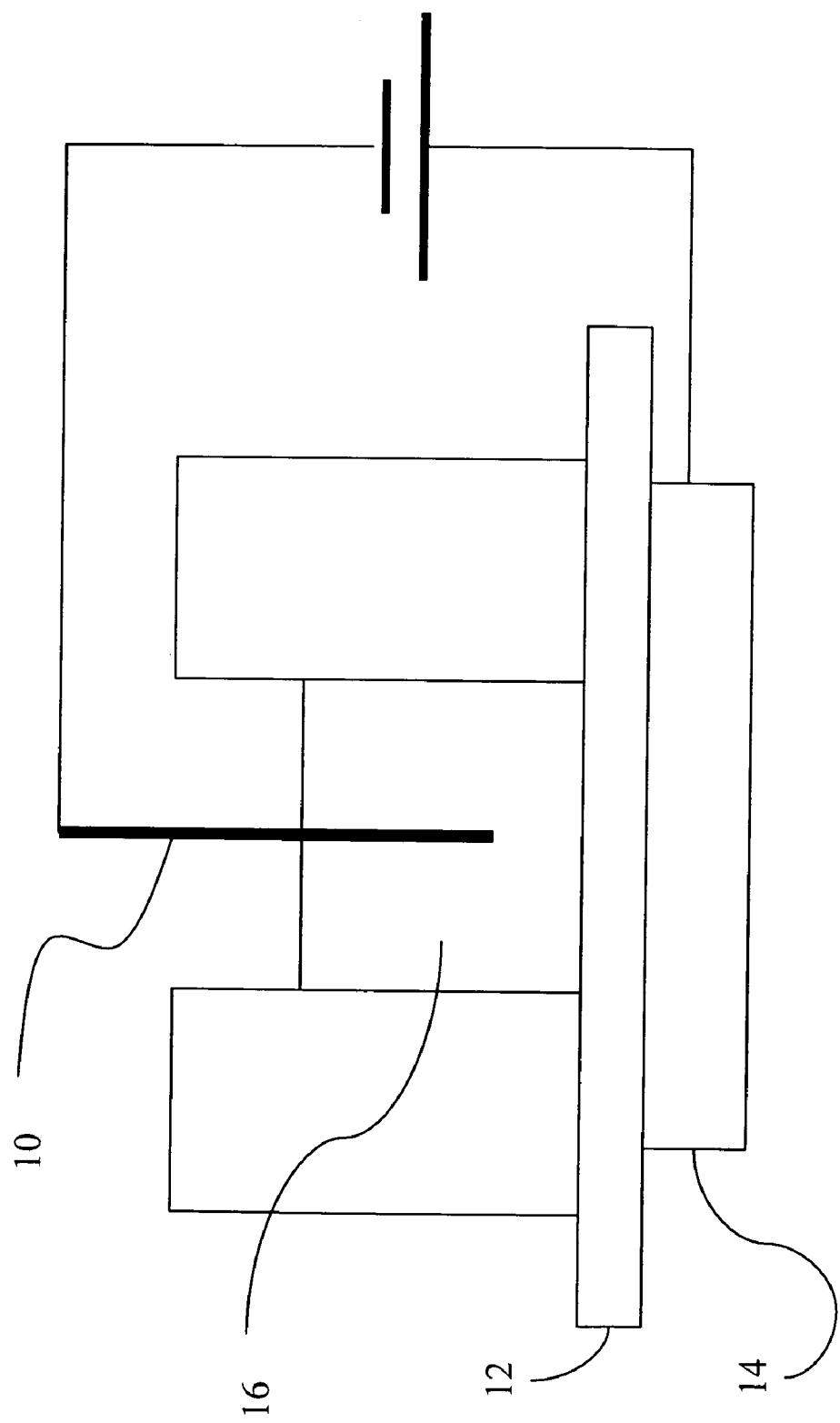
FIG. 1 is a schematic diagram of an exemplary deposition configuration for forming silicon nanoparticle nanotubes in accordance with the invention.

The invention concerns silicon nanoparticle nanotubes and methods for making the same. The silicon nanoparticle nanotubes exhibit flexibility unlike that of bulk silicon. The nanotubes of the invention possess the luminescence properties of the silicon nanoparticle material used to form the nanotubes. In embodiments of the invention, nanotubes are formed from a colloid of silicon nanoparticles substantially consisting of a single size of nanoparticle, and in other embodiments the nanotubes are formed from a colloid of other sizes of silicon nanoparticles. An example including a colloid of other sizes of silicon nanoparticles includes a number of discretely sized particles, for example the family including 1 (blue emitting), 1.67 (green emitting), 2.15 (yellow emitting), 2.9 (red emitting) and 3.7 nm (infrared emitting). See, G. Belomoin et al. "Observation of a magic discrete family of ultrabright Si nanoparticles," Appl. Phys. Lett. 80(5), p 841 (Feb. 4, 2002); and United States Published Patent Application 20020070121 to Nayfeh et al. Silicon nanoparticles formed by other methods and dispersed into a colloid may also be used to form nanotubes, for example a colloid of nanoparticles in the range of ~1-10 nm.

Nanotubes of the invention have a characteristic flexibility that approaches that of rubber and is far distant from that of bulk silicon. They can be produced in uniform shape, diameter and length. Nanotubes of the invention may be suited for a variety of applications requiring flexible materials, and possibly also requiring the unique luminescent properties of the nanotubes of the invention.

Biological molecule manipulation and detection may benefit from application of silicon nanoparticle nanotubes of the invention, including use in in vivo applications. Silicon nanotubes of the invention, for example, might be functionalized with a binding agent that attracts a molecule of interest. The luminescent properties of a silicon nanoparticle nanotube then present an opportunity to interrogate for the presence of a molecule of interest.

In an example, molecules such as biotins and proteins are selectively attached to and released from silicon nanoparticle nanotubes. Silicon is a generally benign material in a biological system. Living cells manipulated with silicon nanoparticle nanotubes should not be adversely affected by interaction with tubes and therefore such interaction should not significantly perturb the living cells.

The silicon nanoparticle material used in the nanotubes of preferred embodiments of the invention exhibits important behavior such as ultrabright size dependent-photoluminescence, photostability and stimulated emission. Nanotubes of the invention may provide a building block for optoelectronics (e.g., nanodiodes) and biomedical devices (tags for cell detection). Formed silicon nanoparticle nanotubes may be manipulated and moved, for example with a scanning tunneling microscope (STM) tip or an atomic force microscope (AFM) tip. Nanotubes may also be bonded together to form two or three dimensional bundles of nanotubes.

In a preferred embodiment method of the invention, a relatively thick electrode, e.g. a 5 mm platinum rod, is positioned with its axis generally perpendicular to the surface of a substrate/second electrode. Other configurations are possible such as the parallel configuration, but the perpendicular configuration provides the thinnest films. Whether the film formed will roll up into a nanotube depends upon the area of deposit, which can also be made small by subdividing the surface of the substrate, and the thinness of the film. The electrode and the substrate surface are both contacted by a solution including silicon nanoparticles. The substrate surface is completely immersed in the solution in a manner such that there is not an air/solution interface and there is no meniscus at the substrate surface. Application of electrical potential between the electrode and the substrate creates a film of silicon nanoparticles on the substrate. Drying of the film induces the film to roll up and form a silicon nanoparticle nanotube material. A silicon nanoparticle nanotube material of the invention includes nanotubes formed of silicon nanoparticles.

Experiments have been conducted to test the formation process of the invention. The experiments provide some additional preferred embodiments, as will be understood by artisans, without limiting the invention in its broader aspects. The experiments will now be discussed.

FIG. 1 shows an example electrochemical cell configuration used to test the invention. In the experiments, a sufficiently thick electrode 10 was positioned substantially normal to a substrate/second electrode 12 contacted on its back side to an electrical contact 14, as shown in FIG. 1. The substrate 12 and the electrode 10 both contact an aqueous solution of alcohol 16. In FIG. 1, the substrate 12 has a portion of its surface completely immersed at the bottom of the electrochemical cell. As there is no air/solution interface, there will be no meniscus at the surface where silicon nanoparticles are being deposited. When the electrode 10 is sufficiently thick, uniform films of silicon nanoparticles form on the substrate 12, whereas a thin electrode tends to produce flakes typically about 2 μm wide. The electrodes are placed in a solution including a dispersion of silicon nanoparticles. Biasing of the electrodes for a period of time results in the deposition of patches of uniform films of silicon nanoparticles, in addition to tree-like assemblies.

In experiments, we used a 5 mm diameter stainless steel rod as the cathode, and an aqueous alcohol solution of dispersed blue luminescent $Si_{29}H_{24}$ nanoparticles of 1 nm diameter. Rods of greater diameter than 5 mm will also work, and a range of smaller diameter rods will also produce thin films. The lower size limit of the electrode can be determined experimentally by observing whether thin films with the rolling-up characteristics form. Other materials for the electrode include standard conductive materials used in electrochemical etching, e.g., platinum. A current in the range of 0.1 mA-1 mA with 100-500 V is used. The substrate 12 was a silicon wafer, which was disposed a few millimeters away from the electrode 10. The deposition resulted in circular patches of about 100 to 200 microns in diameter with the substrate being stationary. Other shapes may form such as rectangular if a mold of rectangular shape and small enough area is used. As an example, the substrate may be etched by standard fabrication techniques with a pattern of grooves that subdivide the surface of the substrate.

Deposited films are very smooth as checked by atomic force microscopy (AFM). After deposition, the substrate is removed from the solution. Upon drying, the film patches formed on the substrate roll up into uniform tubes of a diameter ranging from about 2 to 5 μm The diameter of the tubes and the thinness of the films are related, as the thinness of the film must be about 0.01 or less as related to the diameter for a condition to be met where the film will roll up. The deposit of silicon nanoparticles must be in a thinness and area that adheres to the relationship of the diameter being at least about 100 times greater than the film thickness. In the experiments, patches formed that met this condition. It is also possible to subdivide a sufficiently thin film according to this relationship to meet the condition and permit rolling up of the film into nanotubes.

Solely for the purpose of explanation, and without limiting the invention in any way, we believe that this rolling up is due to a spontaneous curvature that originates from the fact that, while drying, the nanoparticles assemblies are more close-packed at the surface where the drying is more important than closer to the substrate where the evaporation is less important. This curvature, thus, is due to a gradient, along the thickness of the film, in the packing.

We have viewed rolled-up nanotubes of silicon nanoparticles and have measured the thickness of this film before it rolls up by measuring the distance between the non-delaminated film (prior to drying) and the bare substrate using AFM. The delamination of the film due to drying to form the nanotubes can be clearly detected by AFM measurements on the surface next to the edge of the delamination. The film thickness was found to be 32 nm, which is the thickness of the walls of the nanotubes that formed.

The nanotubes themselves are important, as is the method for formation. However, we are also interested in the flexibility of the nanotubes that we have produced. To measure the stiffness of a film one should deforms it, or better bend it slightly and measure the response of the film to this deformation. We used an AFM tip to poke a silicon nanoparticle nanotube and deform it slightly.

Figure 2:
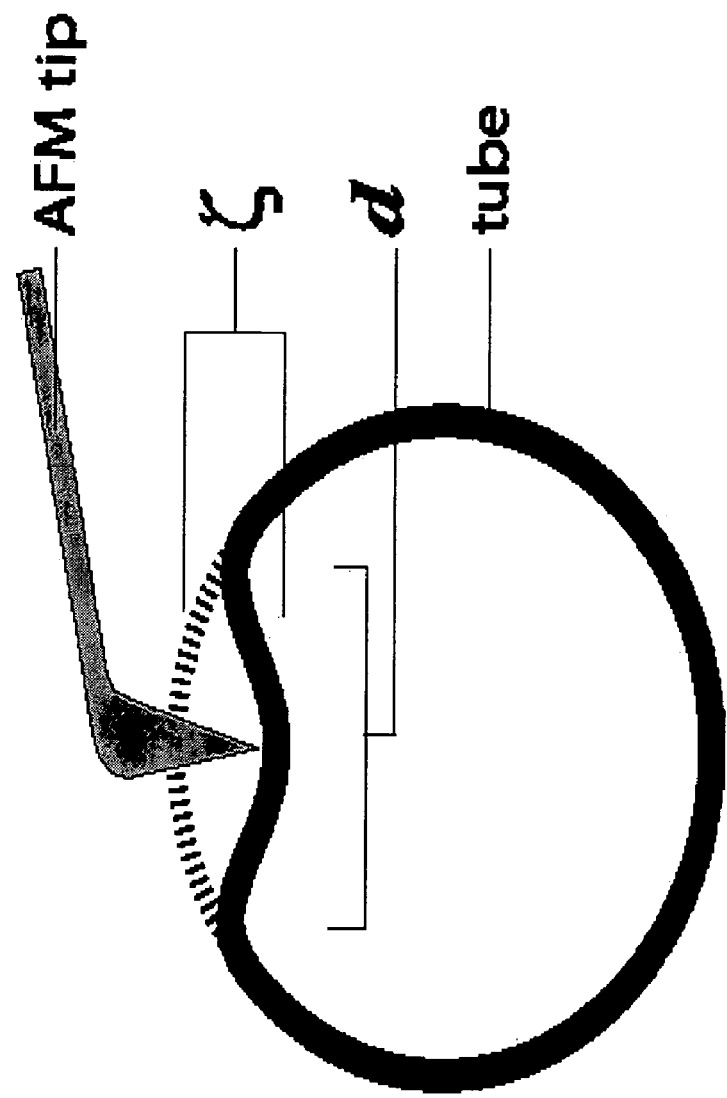
FIG. 2 is a schematic diagram of an experiment used to test the flexibility of a silicon nanoparticle nanotube of the invention.
Figure 3:
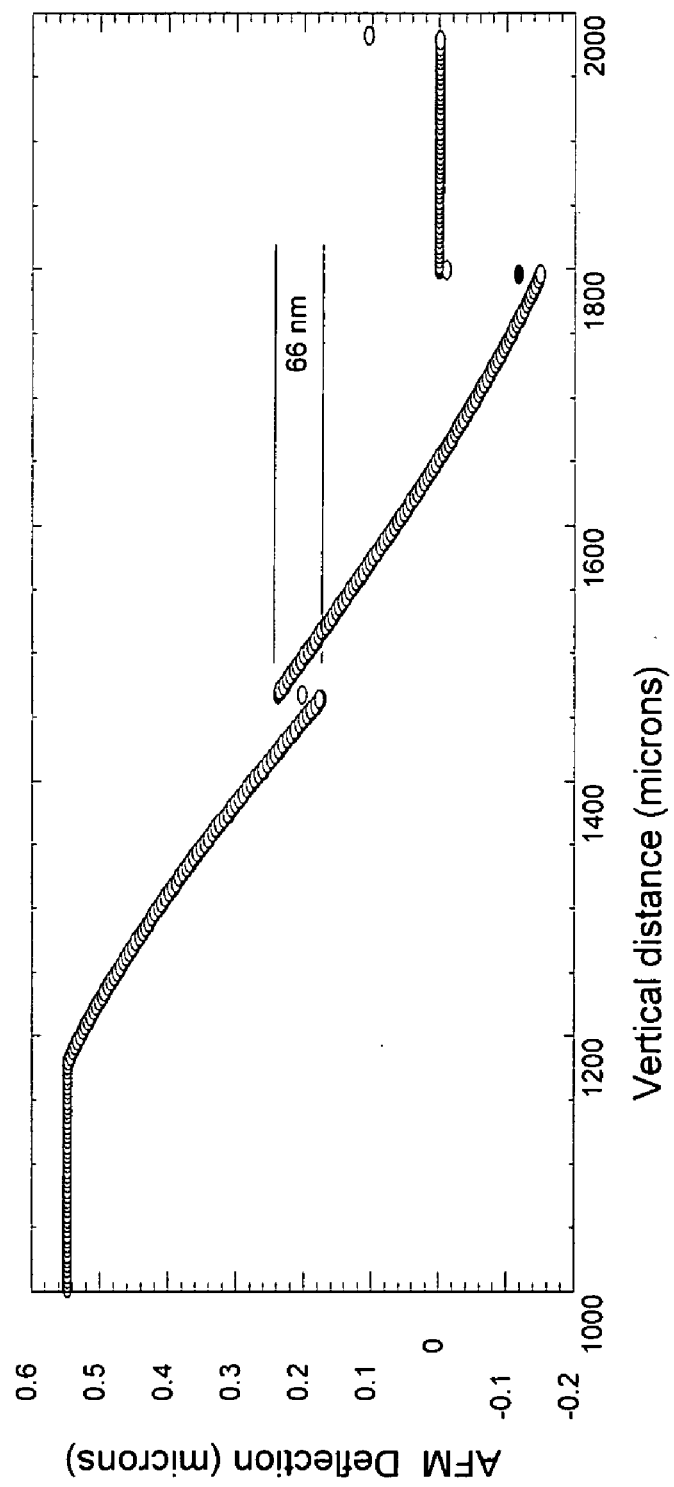
FIG. 3 is a graph of results obtained from the experiment illustrated in FIG. 1.

The tip provoked a local deflection of the tube. This deflection is noted $\zeta$ in FIGS. 2 and 3. This deflection spans a region of linear size d. The measured deflection is about 66 nm and is of the order of the thickness (2 t). We can use linear elasticity to compute the young modulus of the film. The bending energy is of the form $E_b=Et^3 \int ds(1/R)^2$ where ds is the surface of integration and corresponds to the region of larger deflection (We have neglected the poisson ratio, since it wouldn't affect the final result). Using the geometric relation between the curvature 1/R and deflection $\zeta$, this energy becomes $E_b=Et^3 \int ds(\Delta\zeta)^2$. If we suppose that the area of integration ds has an extension d, then the bending energy acquires the scaling form $E_b \sim Et^3 d^2 (\zeta/d^2)^2$. Since the film is locally bent by the action of the AFM, i.e. the region of deflection does not span the whole length of the cylinder, a stretching energy should be taken into account and is written as $E^{str}=Et\int ds(\zeta/R)^2$ where we have used the definition of the strain. Like above, the surface of integration is of the order of $d^2$. The stretching energy becomes $E_{str} \sim Etd^2(\zeta/R)^2$. and the size of this region d that minimizes the total energy (the sum of bending and stretching) is equal to $\sqrt{hR}$. Replacing this value of d into the total energy, we find $E_{tot} \sim Et^2(\zeta^2/R)$. This energy is equal to the work done by the force applied by the AFM tip on the film. The force is then the differential of the total energy with respect to the vertical deflection $\zeta$. This gives us an order of magnitude of the deflection $\zeta \sim fR/Et^2$. Knowing the deflection from the AFM measurement, which is found to be 66 nm and the thickness from the AFM scanning, as well as the radius of the tubes from the SEM images, we can estimate an order of magnitude of the young modulus, $E \sim fR/\zeta t^2 \sim 0.06$ GPa. This value of the young modulus is several order of magnitude (~5000) smaller than that of bulk silicon and is just 30 times larger than that of rubber. The flexibility of these tubes may be due to the way the nanoparticles are packed.

We observed electron diffraction in the transmission of electrons through the tube walls. The diffraction pattern showed a central beam and a system of spots. This indicates that the nanotube is made of tiny ordered superlattices. Other diffraction patterns taken from another region of the nanotube show that the spots are approaching the condition of being arranged in a set of concentric circles, which indicates some degree of random orientation of the superlattice units in that region. From the analysis of the position of the spots and the size of the circles, we find that the smallest length scale, corresponding to the largest circle is ~1 nm while the largest length scale corresponding to the smallest circle is ~4 nm.

Figure 4:
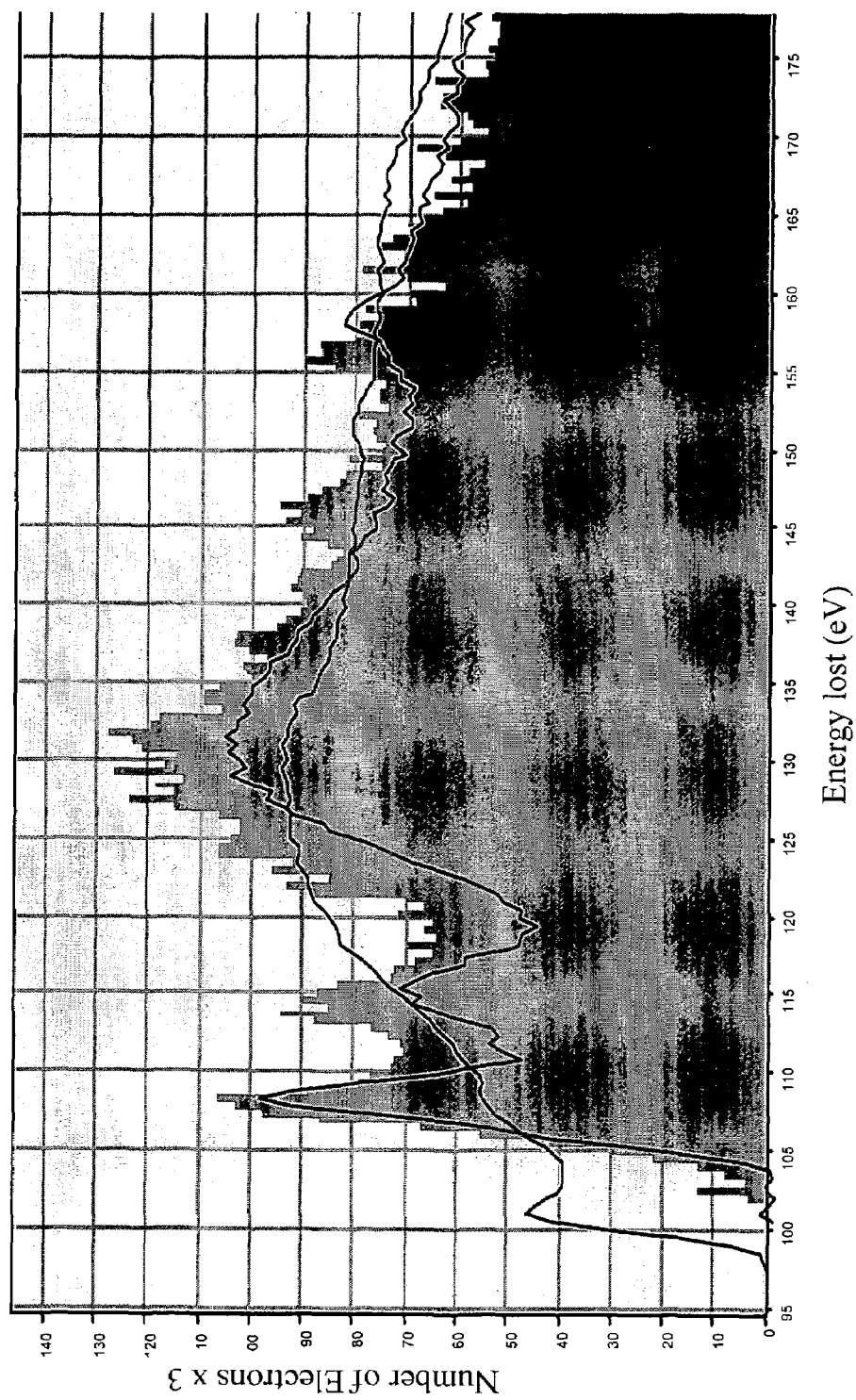
FIG. 4 is a graph showing the electron energy loss spectrum for silicon nanoparticle nanotubes of the invention measured in experiments.

We also investigated the chemical composition of the silicon nanoparticle nanotubes. Using energy electron loss spectrum (EELS) and found that the films are mainly made of pure silicon and silicon oxides, as indicated in the data shown in FIG. 4. We also conducted FTIR. EELS and FTIR (Fourier transform infrared data) showed that only silicon and oxygen were present in the film.

We suspect that the silicon nanoparticle nanotubes are made of silicon nanoparticles held together via oxygen to form a three dimensional centered cubic network. The structure of the blue luminescent particles $Si_{29}H_{24}$ is nearly spherical but contains a combination of hexagon and pentagon ring structures (Td point group symmetry) that produce a highly wrinkled- or "puckered-ball" surface. A 1 nm silicon nanoparticle consists of a central core Si atom and four Si atoms in a tetrahedral coordination, constituting an inner core (inner shell). The remaining 24 atoms constitute an outer Si surface (outer shell), which has a hydrogen terminated bulk-like (2×1) reconstruction of dimer pairs on (001) facets (6 reconstructed surface dimers). Alternatively, one can think of the structure as a 28 atom fullerene cage with a Td atom in the center. Once the core atom is connected to the fullerene, the remaining atoms are passivated with hydrogen. The particles are prepared with this specific hydrogen configuration ($Si_{29}H_{24}$) by the incorporation of hydrogen peroxide in the HF electro chemical etching process used to form the nanoparticles.

In an aqueous electrophoresis process used to form patches of nanoparticle films in the present invention, the nanoparticles acquire oxygen from water molecules present in the aqueous mixture to form $Si_{29}(HO)_{24}$. Fourier transform infrared (FTIR) spectroscopy shows that the initial hydrogen in $Si_{29}H_{24}$ has been replaced after the deposition and formation of the film or tube by a strong Si—O stretch at ~1050 $cm^{-1}$. This is indicative of a S—O—Si linkage or bridge type bonding between the particles. The oxygen does not permeate the particles as indicated by the fact that the silicon nanoparticle nanotubes are luminescent, and EELS shows the correct pure silicon component of 23 percent. In each silicon particle, there are twenty-four sites of OH that have the potential to produce an oxygen bridge, consistent with the percentage obtained in the EELS measurements. Incomplete hydroxylation and steric requirements relative to the silicon surface may result in some degree of randomization of the superlattice units.

The mass production of identical tubes can be accomplished. As discussed above, the substrate may be etched with grooves prior to deposit. In other embodiments, using raster scanning of a laser beam or an electron beam can be used to subdivide a given film into an array of identical portions after a film is formed. The identical portions will roll into identical tubes having same length and diameter. The subdivision should be done before full drying of the film. The action of the laser beam will dry a local area along its path. Bundles of nanotubes may be formed by bringing tubes together in one, two, or three dimensional formations (such as by manipulating with a robotic arm such as AFM or STM) and steaming the bundle with water vapor and then drying to produce hydrogen bonding between the tubes.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for forming silicon nanoparticle nanotubes, the method comprising steps of:
    disposing a conductive or semiconductive substrate in a solution including a dispersion of silicon nanoparticles, said disposing being done in a manner to avoid a meniscus being formed on a surface of the substrate;
    disposing a thick electrode opposite the surface of the substrate;
    applying electrical potential between the substrate and the thick electrode;
    maintaining the electrical potential between the substrate and the thick electrode to form a thin film of silicon nanoparticles on the substrate; and
    drying the thin film to induce it to roll into a silicon nanoparticle nanotube;
    wherein the area and thickness of the thin film is such that a diameter of the silicon nanoparticle nanotube is at least about 100 times greater than the thickness of the thin film.

2. The method of claim 1, wherein the substrate comprises a silicon wafer.

3. The method of claim 1, wherein said step of disposing a conductive or semiconductive substrate comprises horizontally disposing the surface of the substrate at the bottom of an electrochemical etching cell including the solution.

4. The method of claim 3, wherein the thick electrode comprises a metal rod.

5. The method of claim 4, wherein the metal rod has a diameter of at least about 5 nm.

6. The method of claim 4, wherein said step of disposing a thick electrode comprises disposing the metal rod substantially perpendicular to the surface of the substrate.

7. The method of claim 1, further comprising a step of subdividing the thin film prior to said step of drying.

8. The method of claim 7, wherein said step of subdividing is conducted to divide the thin film into uniform regions, and the method forms a plurality of silicon nanoparticle nanotubes having the same dimensions.

9. The method of claim 8, further comprising a step of bundling formed silicon nanoparticle nanotubes together.

10. Silicon nanoparticle material, comprising a flexible nanotube formed of silicon nanoparticles.

11. The material of claim 10, wherein the flexible nanotube comprises 1 nm silicon nanoparticles.

12. The material of claim 10, wherein the flexible nanotube comprises an Silicon-Oxygen superlattice structure.

13. The material of claim 10, comprising a plurality of flexible nanotubes formed of silicon nanoparticles.

14. The material of claim 13, wherein said plurality of flexible nanotubes are bundled together.

* * * * *

UNITED STATES PATENT AND TRADEMARK OFFICE
CERTIFICATE OF CORRECTION

PATENT NO. : 7,429,369 B2  Page 1 of 1
APPLICATION NO. : 10/864072
DATED : September 30, 2008
INVENTOR(S) : Nayfeh et al.

It is certified that error appears in the above-identified patent and that said Letters Patent is hereby corrected as shown below:

Col. 5, line 11    Please delete "$E^{str}$" and insert --$E_{str}$-- in its place Signed and Sealed this Twenty-sixth Day of May, 2009

JOHN DOLL
*Acting Director of the United States Patent and Trademark Office*